(12) United States Patent
Pradeep et al.

(10) Patent No.: US 11,047,910 B2
(45) Date of Patent: Jun. 29, 2021

(54) PATH BASED CONTROLS FOR ATE MODE TESTING OF MULTICELL MEMORY CIRCUIT

(71) Applicant: TEXAS INSTRUMENTS INCORPORATED, Dallas, TX (US)

(72) Inventors: Wilson Pradeep, Bangalore (IN); Prakash Narayanan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/185,660

(22) Filed: Nov. 9, 2018

(65) Prior Publication Data

US 2019/0204382 A1    Jul. 4, 2019

Related U.S. Application Data

(60) Provisional application No. 62/611,676, filed on Dec. 29, 2017, provisional application No. 62/611,704, filed on Dec. 29, 2017.

(51) Int. Cl.

| G01R 31/317 | (2006.01) |
|---|---|
| G01R 31/3177 | (2006.01) |
| G11C 29/56 | (2006.01) |
| G06F 11/10 | (2006.01) |
| G11C 29/36 | (2006.01) |
| G11C 29/42 | (2006.01) |

(52) U.S. Cl.
CPC ... *G01R 31/3177* (2013.01); *G01R 31/31718* (2013.01); *G01R 31/31724* (2013.01); *G06F 11/1048* (2013.01); *G06F 11/1068* (2013.01); *G11C 29/36* (2013.01); *G11C 29/42* (2013.01); *G11C 29/56004* (2013.01); *G11C 2029/3602* (2013.01); *G11C 2029/5602* (2013.01)

(58) Field of Classification Search
None
See application file for complete search history.

(56) References Cited

U.S. PATENT DOCUMENTS

| 5,602,855 | A * | 2/1997 | Whetsel, Jr. ... | G01R 31/318541 324/73.1 |
|---|---|---|---|---|
| 6,898,544 | B2 * | 5/2005 | Whetsel, Jr. ... | G01R 31/318541 438/5 |
| 7,505,353 | B2 * | 3/2009 | Kim | G11C 7/1075 365/189.02 |
| 7,913,138 | B2 * | 3/2011 | Sawamura | G01R 31/31726 714/731 |
| 8,120,986 | B2 * | 2/2012 | Kim | G11C 7/1075 365/189.02 |

(Continued)

*Primary Examiner* — Phung M Chung
(74) *Attorney, Agent, or Firm* — Ebby Abraham; Charles A. Brill; Frank D. Cimino

(57) ABSTRACT

A test override circuit includes a memory that includes multiple memory instances. A path selector receives a control signal from automatic test pattern generator equipment (ATE) to control data access to data paths that are operatively coupled between the memory instances and a plurality of logic endpoints. The path selector generates an output signal that indicates which of the data paths is selected in response to the control signal. A gating circuit enables the selected data paths to be accessed by at least one of the plurality of logic endpoints in response to the output signal from the path selector.

20 Claims, 4 Drawing Sheets

(56) References Cited

U.S. PATENT DOCUMENTS

| | | | |
|---|---|---|---|
| 8,261,138 B2* | 9/2012 | Chang | G11C 8/16 |
| | | | 714/718 |
| 10,037,244 B2* | 7/2018 | Chung | G06F 3/064 |
| 10,228,420 B2* | 3/2019 | Srinivasan | G01R 31/31724 |
| 10,393,804 B2* | 8/2019 | Srinivasan | G01R 31/31727 |

* cited by examiner

PATH BASED CONTROLS FOR ATE MODE TESTING OF MULTICELL MEMORY CIRCUIT

CROSS REFERENCE TO RELATED APPLICATIONS

This application claims the benefit of U.S. Provisional Patent Application 62/611,704 filed on 29 Dec. 2017, and entitled PATH BASED CONTROLS FOR ATE MODE TESTING OF MULTICELL MEMORY CIRCUIT, the entirety of which is incorporated by reference herein. This application also claims the benefit of U.S. Provisional Patent Application 62/611,676 filed on 29 Dec. 2017, and entitled DYNAMIC GENERATION OF ATPG MODE SIGNALS FOR TESTING MULTIPATH MEMORY CIRCUIT, the entirety of which is incorporated by reference herein.

TECHNICAL FIELD

This disclosure relates to memory circuits, and more particularly to a test override circuit to selectively control access between memory instances and a plurality of logic endpoints in response to test control signals.

BACKGROUND

The higher clock frequencies and smaller geometry sizes in today's integrated circuits have led to an increase in speed related defects which are commonly referred as transition delay faults. Thus, it is desirable that the devices are screened for such faults using at-speed testing. Effective scan-based at-speed test techniques are available in leading automated test pattern generator (ATPG) tools. The most common at-speed tests to check for manufacturing defects and process variations include test patterns created for transition and path-delay fault models. With increase in the memory content in respective designs to be tested, more and more critical testing paths are related to memory interface paths. Memory interface paths currently are tested using two different methods—ATPG testing and built-in self testing (BIST). In both cases, the actual true data path starting at functional logic and passing through the functional interface of the memory is generally not tested.

Random access memory (RAM) sequential ATPG is an ATPG method to cover the memory functional interface path. It tests memories through the actual timing critical paths by generating effective memory interface structural tests. Various challenges exist in generating suitable quality Ram-sequential patterns with higher test-coverage and optimized test-pattern count for memory dominated designs. One of these challenges includes complex memory architectures such as memory implementations which contain memory self-loops and/or other testing paths within a larger memory structure to be tested. Another challenge includes ATPG controllability and observability issues due to inflated fan-in/fan-out requirements and increased logic depth due to complex arbitration logic for the respective memories.

SUMMARY

This disclosure relates to a test override circuit to selectively control access between memory instances and a plurality of logic endpoints in response to test control signals. In one example, a test override circuit includes a memory that includes multiple memory instances. A path selector receives a control signal from automatic test equipment (ATE) to control data access to data paths that are operatively coupled between the memory instances and a plurality of logic endpoints. The path selector generates an output signal that indicates which of the data paths is selected in response to the control signal. A gating circuit enables the selected data paths to be accessed by at least one of the plurality of logic endpoints in response to the output signal from the path selector.

In another example, a test override circuit includes a memory that includes multiple memory instances. A path selector receives a control signal from automatic test equipment (ATE) to control data access to data paths that are operatively coupled between the memory instances and a plurality of logic endpoints. The path selector generates an output signal that indicates which of the data paths is selected in response to the control signal. The path selector includes a decoder that receives a path input command and generates at least one path control output signal to enable at least one of the plurality of logic endpoints to access at least one of the multiple memory instances of the memory in response to the control signal. The at least one path output signal drives at least one multiplexer to generate the output signal. A gating circuit enables the selected data paths to be accessed by at least one of the plurality of logic endpoints in response to the output signal from the path selector.

In yet another example, a method includes receiving a control signal from automatic test equipment (ATE to control data access to data paths that are operatively coupled between a plurality memory instances and a plurality of logic endpoints. The method includes generating an output signal that indicates which of the data paths is selected in response to the control signal. The method includes controlling which of the selected data paths are to be accessed by at least one of the plurality of logic endpoints in response to the output signal.

DETAILED DESCRIPTION

This disclosure relates to a test override circuit to selectively control access between multi-instance memories and a plurality of logic endpoints in response to test control signals. Selective control enables controlled testing of the paths through which faults on a given memory interface are being tested. This includes testing functional worst case paths (e.g., paths that includes longest circuit timing chains)

which facilitates overall testing quality overall current systems. The test override circuit includes a path selector that receives a control signal from automatic test equipment (ATE) to control data access to data paths that are operatively coupled between a plurality of memory instance and a plurality of logic endpoints (e.g., processors, state machines, gate arrays, and so forth). In one example, the memory instances can be arranged as a shared memory having multiple individually controllable memory instances in the shared memory that can be accessed by multiple logic endpoints where the test override circuit controls which of the paths between the logic endpoints and the shared memory instances are enabled during ATE testing. In another example, the memory instances can be arranged as a data memory and an error checking and correction (ECC) memory where the test override circuit controls which output from the data memory or the ECC memory is provided to at least one of the logic endpoints. The path selector generates an output signal that indicates which of the data paths is selected in response to the control signal. A gating circuit enables the selected data paths to be accessed by at least one of the logic endpoints in response to the output signal from the path selector.

In one example, data path gating is provided where the path selector controls which of the logic endpoint data paths is coupled to which of the memory instances during ATE testing. With respect to data path gating, individual logic endpoints can be gated separately from individual memory instances which can in turn be gated to allow circuit testing paths to be dynamically constructed such as to enable longest path testing between one of the logic endpoints and one of the memory instances. Another type of gating that can be controlled by the path selector includes clock gating where clock signals to the logic endpoints and/or memory instances can be individually enabled or disabled to allow circuit testing paths to be dynamically constructed. Yet another type of gating controllable by the path selector includes output gating where data from a respective memory cell (e.g., ECC memory and associated data memory) is routed to a given logic endpoint via the path selector. By allowing the ATE system to selectively control circuit paths via the path selector and gating circuit, the quality of automated testing can be increased (e.g., more circuit paths covered at worst case timing) and also mitigate any potential test escapes.

Figure 1:
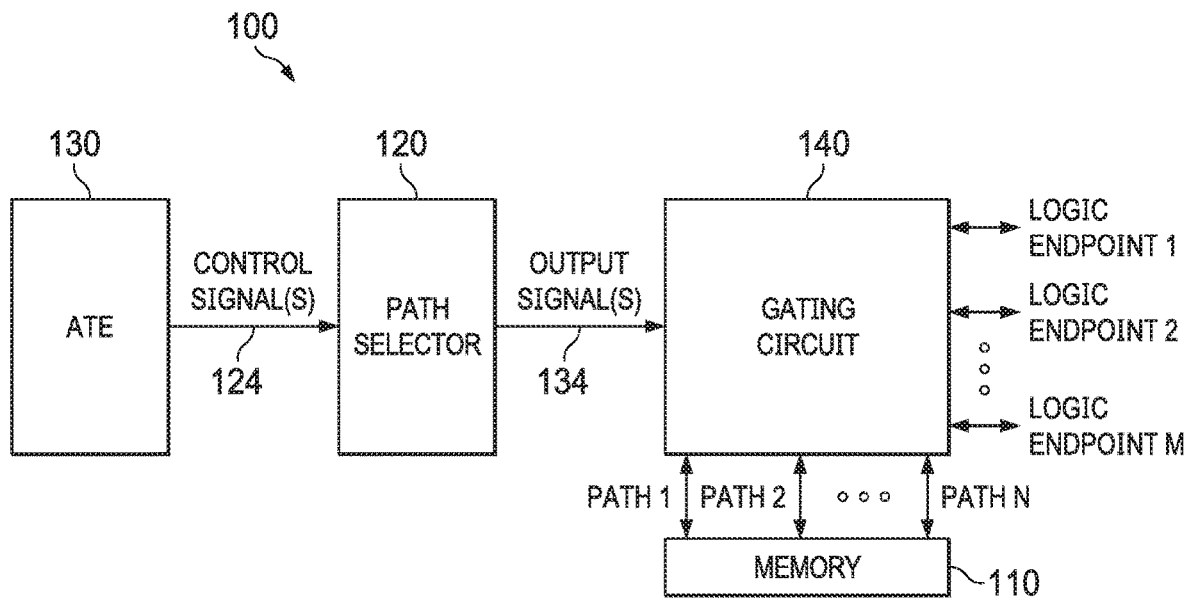
FIG. 1 illustrates an example block diagram of a test override circuit to selectively control access between multi-instance memories and a plurality of logic endpoints in response to test control signals.

FIG. 1 illustrates an example block diagram of a test override circuit 100 to selectively control access between multi-instance memories and a plurality of logic endpoints in response to test control signals. As used herein, the term "circuit" can include a collection of active and/or passive elements that perform a circuit function, such as an analog circuit or control circuit. Additionally or alternatively, for example, the term "circuit" can include an integrated circuit (IC) where all and/or some of the circuit elements are fabricated on a common substrate (e.g., semiconductor substrate). The test override circuit 100 includes a memory 110 that includes multiple memory instances. As used herein, the term memory instance refers to a circuit that contains a memory along with other components that allow functional operation of the memory in functional mode along with testing of the memory in test mode. Also, as used herein, the term multi-instance memory refers to a collection of instances that collectively contribute to provide an overall output data result from the memory 110. Each instance provides a different memory function yet in some manner is responsible for the output data result. One example of a multi-instance memory 110 is a data memory that provides one path for the output of the memory and an associated error checking and correction (ECC) memory instance providing another path output that is updated when the data memory is written to and read from when the data memory is read. Another example of a multi-instance memory is a shared memory having multiple memory banks where each of the memory banks of the shared memory can be accessed by one or more of a plurality of logic endpoints. As used herein, the term logic endpoint can be any type of logic circuit including processors, gate arrays, state machines, and/or other logic functions.

A path selector 120 receives a control signal 124 (or signals) from automatic test equipment (ATE) 130 to control data access to data paths shown as paths 1 through N that are operatively coupled between the memory instances of the memory 110 and a plurality of logic endpoints 1 though M, where M and N are positive integers respectively. The path selector 120 generates an output signal 134 (or signals) that indicate which of the data paths 1-N is selected in response to the control signal 124. A gating circuit 140 enables the selected data paths 1-N to be accessed by at least one of the plurality of endpoints 1-M in response to the output signal 134 from the path selector 120. In one example, the path selector 120 generates the output signal 134 to enable at least one data path gate (see e.g., FIG. 2) in the gating circuit 140 to provide data access between at least one of the plurality of logic endpoints 1-M and at least one of the multiple memory instances of the memory 110 in response to the control signal 134 where the memory is a shared memory that is accessed by each of the plurality of logic endpoints. An example of data path gating and control is illustrated in FIG. 2.

Figure 3:
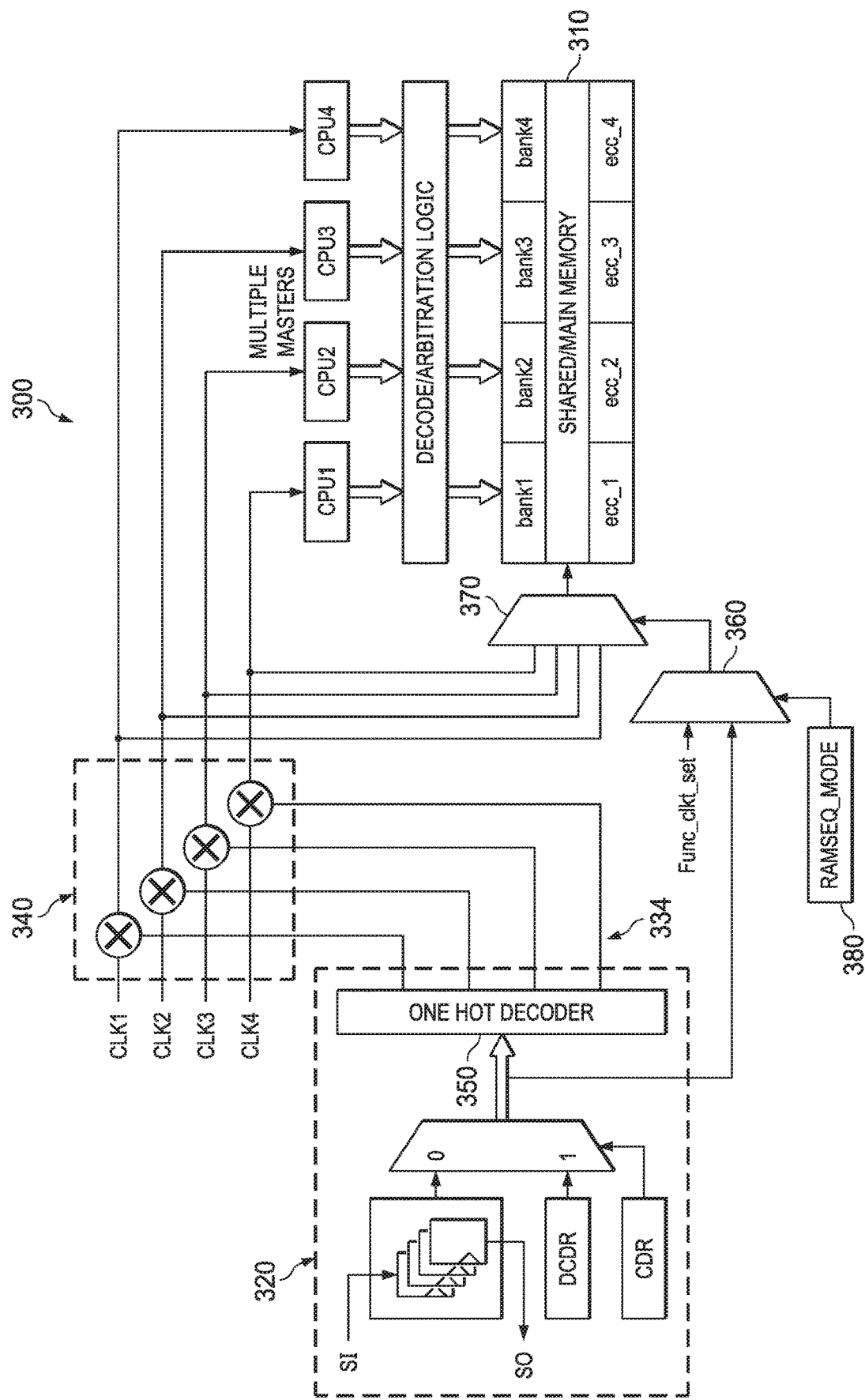
FIG. 3 illustrates an example of a test override circuit to selectively control access via clock gating between multi-instance memories and a plurality of logic endpoints in response to test control signals.

In another example, the path selector 120 generates the output signal 134 to enable at least one clock gate (see e.g., FIG. 3) in the gating circuit to enable at least one of the plurality of logic endpoints to access at least one of the multiple memory instances of the memory in response to the control signal 124 where the memory is a shared memory that is accessed by each of the plurality of logic endpoints. An example of clock gating and control is illustrated in FIG. 3.

Figure 4:
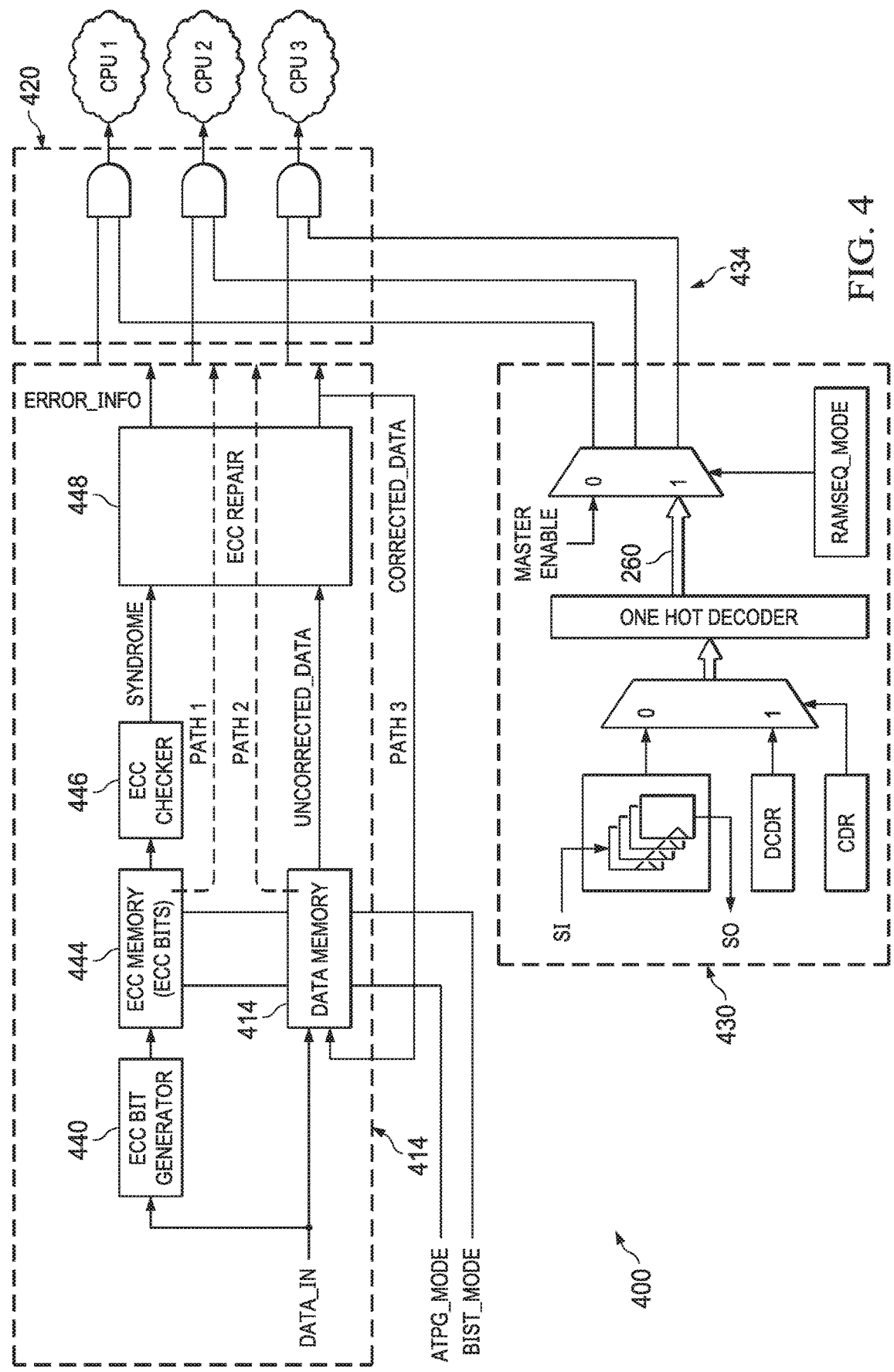
FIG. 4 illustrates an example of a test override circuit to enable at least one of multiple memory instances of a memory to drive at least one of a plurality of logic endpoints in response to test control signals.

In yet another example, the path selector 120 generates the output signal 134 to enable at least one output gate (see e.g., FIG. 4) in the gating circuit to enable at least one of the multiple memory instances of the memory 110 to drive at least one of the plurality of logic endpoints 1-M in response to the control signal 124 where the memory includes an error checking and correction (ECC) memory as one of the multiple memory instances and another one of the multiple memory instances includes a data memory. The ECC memory stores at least one ECC bit that corresponds to data that is stored in the data memory. An example of output path gating and control is illustrated in FIG. 4. Various decoders, multiplexers and other control elements can be provided in the path selector 120 to facilitate data path control for ATPG testing as described herein. For instance, the path selector 120 can include a decoder (e.g., one hot decoder) that receives a path input command and generates at least one path control output signal to enable at least one of the plurality of logic endpoints 1-M to access at least one of the multiple memory instances of the memory 110 in response to the control signal 124. Examples of such elements are illustrated and described below with respect to FIGS. 2-4.

Figure 2:
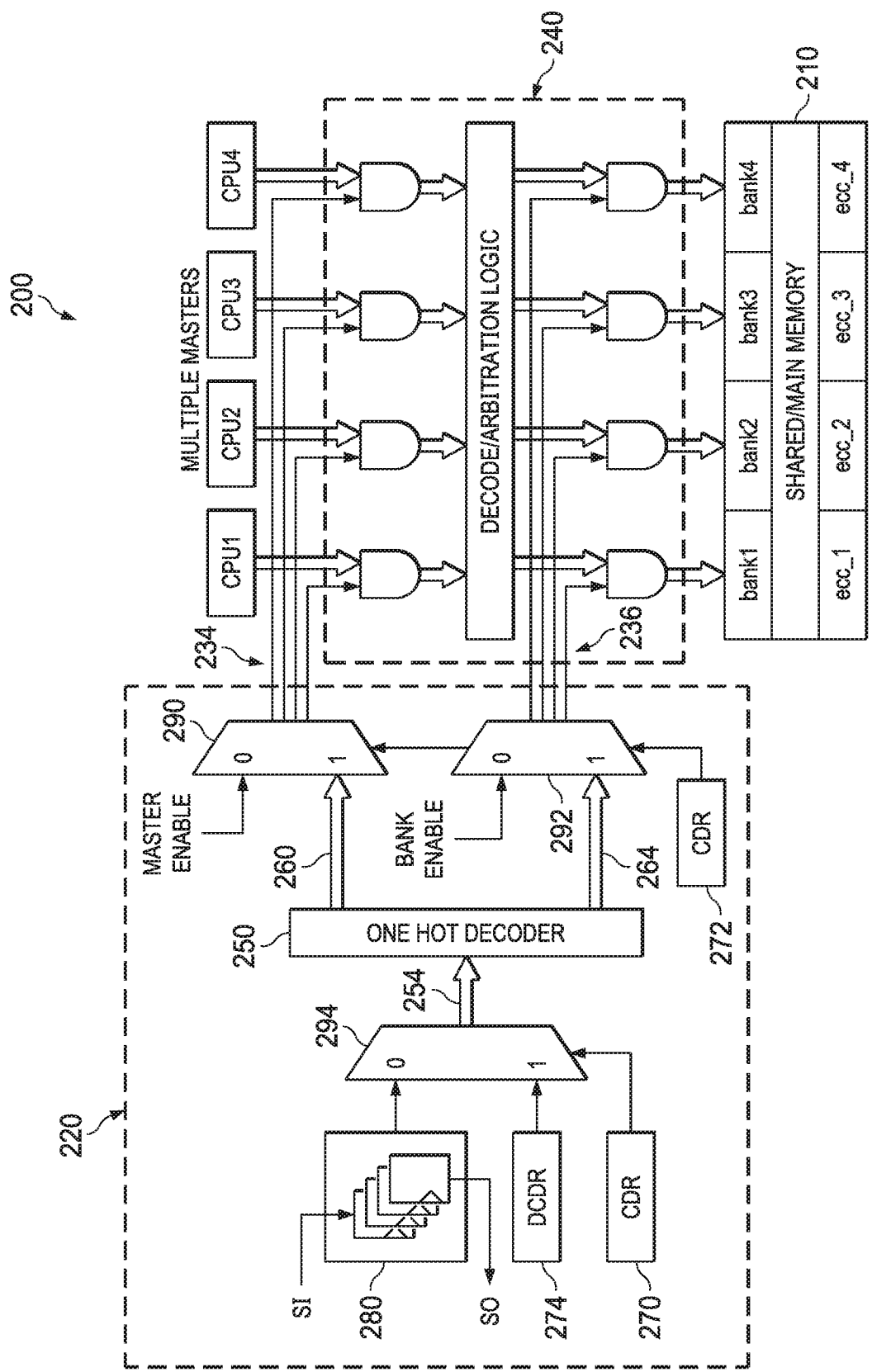
FIG. 2 illustrates an example of a test override circuit to selectively control data paths via data path gating between multi-instance memories and a plurality of logic endpoints in response to test control signals.

FIG. 2 illustrates an example of a test override circuit 200 to selectively control data paths via data path gating between multi-instance memories and a plurality of logic endpoints in response to test control signals. The test override circuit 200 includes a memory 210 that includes multiple memory instances which are shown as shared memory banks 1 through 4, each bank having an associated ECC memory 1 though 4. A path selector 220 receives a control signals from automatic test equipment (ATE) (not shown) which can be driven from test vectors provided by an automatic test pattern generator (ATPG) (not shown) to control data access to data paths that are operatively coupled between the memory instances of the memory 210 and logic endpoints which are shown as central processing units (CPUs) 1 though 4 in this example. More or less than four memories and/or CPUs can be provided than shown in the circuit example of 200. The path selector 220 generates output signals shown at 234 and 236 that indicate which of the data paths is selected in response to the control signals. A gating circuit 240 enables the selected data to be accessed by at least one of the CPUs 1-4 in response to the output signals 234 and 236 from the path selector 220. In this example, the path selector generates the output signals 234 and 236 to enable at least one data path gate in the gating circuit 240 to provide data access between at least one of the CPUs 1-4 and at least one of the multiple memory instances of the memory 210 in response to the control signal where the memory is a shared memory in this example and can be accessed by each of the CPUs.

As shown, the path selector 220 can include a decoder 250 that receives a path input command 254 and generates at least one path control output signal at 260 and 264 to enable at least one of the CPUs 1-4 to access at least one of the multiple memory instances of the memory 210 in response to the control signals provided by the ATE. The control signals can be provided by the ATE and received via core data registers (CDR) 270 and 272, dynamic core data register 274, and a register scan chain 280 which writes and reads ATPG test vectors via shift in (SI) and shift out (SO) signals respectively. The test control signals generated using the CDR 270 and 272 are static. These control signals remain constant for a given set of test vectors. The control signals generated using the dynamic core data register 274 are dynamic. Thus, each test vector can have different combinations/values of control signals.

The path control output signal includes a first output signal 260 to drive a first multiplexer 290 that enables at least one CPU and a second output signal 264 to drive a second multiplexer 292 to enable at least one of the multiple memory instances 210 to communicate with the enabled CPU and/or ATPG. Each of the first multiplexer 290 and the second multiplexer 292 are controlled via the data register 272 to select between test mode and functional mode of an integrated circuit that includes the CPUs 1-4 and the memory 210 that communicate via the data paths. The first multiplexer 290 receives a master enable input to enable the gating circuit during functional mode and the second multiplexer 292 receives a bank enable signal to enable the gating circuit 240 during functional mode. During test mode (e.g., MUX control input=1), the path control outputs 260 and 264 control the respective CPUs and memory instances.

The path selector 220 can also include a test multiplexer 294 to drive the decoder 250. The test multiplexer multiplexes between the register scan chain 280 and the dynamic testing register 274 to provide the path input command 254 to the decoder 250. The dynamic testing register 274 provides a static data value in one example or a programmed data value to the decoder 254 based on commands from the ATPG. The test multiplexer 294 can be driven via the data register 270 to control which of the register scan chain 280 or the dynamic testing register 274 provides the path input command to the decoder 250.

FIG. 3 illustrates an example of a test override circuit 300 to selectively control access via clock gating between multi-cell memories and a plurality of logic endpoints in response to test control signals. The test override circuit 300 includes a memory 310 that includes multiple memory instances which are shown as shared memory banks 1 through 4, each bank having an associated ECC memory 1 though 4. A path selector 320 receives a control signals from an automatic test pattern generator (ATPG) (not shown) to control data access to data paths that are operatively coupled between the memory instances of the memory 310 and CPUs 1 though 4 which are shown as the logic endpoints in this example. As mentioned previously, more or less than four memories and/or logic endpoints can be provided than shown in the circuit example of 300. The path selector 320 generates output signals shown at 334 that indicate which of the data paths is selected in response to the control signals.

In this example, the path selector 320 generates the output signals 334 to enable at least one clock gate at 340 in the gating circuit to enable at least one of the CPUs 1-4 to access at least one of the multiple memory instances of the memory 310 in response to the control signal. Similar to the example of FIG. 2, the memory 310 is a shared memory that is accessed by each of the plurality of logic endpoints. The clock gate 340 (or gates) enables or disable clock signals to be applied to the CPUs 1-4 and/or to the memory 310 in response to the output signals 334 from the path selector 320. Similar to the path selector shown in FIG. 2, the path selector 320 can include a decoder 350 that receives a path input command and generates at least one path control output signal at 334 to enable at least one of the CPUs 1-4 to access at least one of the multiple memory instances of the memory 310 in response to the control signals provided by the ATPG. Multiplexors 360 and 370 can be provided control how gated clock signals are provided to the memory 310. A control register 380 can be provided to control whether functional clock signals or test clock signals are provide to the memory 310 via the multiplexer 360.

FIG. 4 illustrates an example of a test override circuit 400 to enable at least one of multiple memory instances of a memory to drive at least one of a plurality of logic endpoints in response to test control signals. In this example, output from a data memory 410 or an ECC memory 414 can be directed to one or more logic endpoints which are shown as CPUs 1-3 in this example via an output gating circuit 420 which is controlled via path selector 430. The path selector 430 generates output signals at 434 to enable at least one output gate in the output gating circuit 420 to enable at least one at least one of the multiple memory instances of the memory to drive at least one of the CPUs 1-3 in response to the control signals described herein. The memory in this example includes the error checking and correction (ECC) memory 414 as one of the multiple memory instances and another one of the multiple memory instances includes the data memory 410, where the ECC memory stores at least one ECC bit that corresponds to data that is stored in the data memory. As shown, the ECC memory can include an ECC bit generator 440, storage for ECC bits at 444, an ECC checker at 446, and an ECC repair block at 448.

Figure 5:
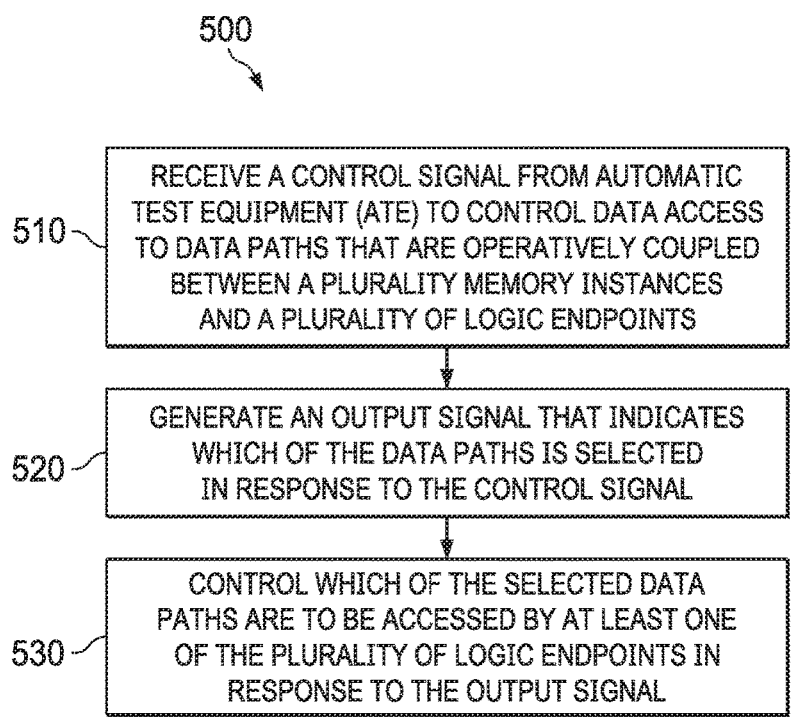
FIG. 5 illustrates an example method to selectively control access between multi-instance memories and a plurality of logic endpoints in response to test control signals.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured as machine readable instructions stored in memory and executable in an integrated circuit or a processor, for example.

FIG. 5 illustrates an example method 500 to selectively control access between multi-instance memories and a plurality of logic endpoints in response to test control signals. At 510, the method 500 includes receiving a control signal from automatic test equipment (ATE) to control data access to data paths that are operatively coupled between a plurality memory instances and a plurality of logic endpoints. At 520, the method 500 includes generating an output signal that indicates which of the data paths is selected in response to the control signal. At 530, the method 500 includes controlling which of the selected data paths are to be accessed by at least one of the plurality of logic endpoints in response to the output signal. The method 500 can also include receiving a path input command and generating at least one path control output signal to enable at least one of the plurality of logic endpoints to access at least one of the plurality of memory instances of the memory in response to the control signal.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
   a memory;
   a gating circuit coupled to the memory;
   a first port coupled to the gating circuit and adapted to be coupled to an external device;
   a path selector having an input adapted to be coupled to an automatic test equipment (ATE) and an output; and
   the gating circuit having an input coupled to the output of the path selector and comprising a plurality of clock gates, the gating circuit configured to enable at least one clock gate in the gating circuit to enable memory access by the external device.

2. The circuit of claim 1, wherein the memory is a shared memory.

3. The circuit of claim 1, wherein the memory includes an error checking and correction (ECC) memory and a data memory, the ECC memory is configured to store at least one ECC bit that corresponds to data stored in the data memory.

4. The circuit of claim 1, wherein the path selector is configured to generate an output signal to enable at least one output gate in the gating circuit, wherein the memory includes an error checking and correction (ECC) memory as one of the multiple memory instances and another one of the multiple memory instances includes a data memory, the ECC memory stores at least one ECC bit that corresponds to data that is stored in the data memory.

5. The circuit of claim 1, the path selector further comprising a decoder that is configured to receive an input command and generate at least one control output signal.

6. The circuit of claim 5, wherein the control output signal includes a first output signal for a first multiplexer to enable memory access by the external device.

7. The circuit of claim 6, wherein the first multiplexer is controlled by a data register to select between a test mode and a functional mode for the circuit.

8. The circuit of claim 5, the path selector further comprising a test multiplexer, the test multiplexer coupled to the decoder and configured to multiplex between a register scan chain and a dynamic testing register.

9. The circuit of claim 8, wherein the dynamic testing register provides a data value to the decoder.

10. The circuit of claim 8, wherein the test multiplexer is driven by a data register that controls which of the register scan chain or the dynamic testing register provides the input command to the decoder.

11. The circuit of claim 8, wherein the output of the test multiplexer is coupled to a clock multiplexer.

12. A circuit, comprising:
    a memory;
    a path selector having a decoder, a multiplexer, and an output, the path selector configured to receives a control signal from automatic test equipment (ATE), an output of the decoder coupled to drive the multiplexer, the path selector configured to generates in response to the control signal, using the decoder and the multiplexer, an output signal that indicates which of a plurality of data paths is selected; and
    a gating circuit having an input coupled to the output of the path selector and comprising a plurality of clock gates, the clock gates configured to enable at least one of the plurality of logic endpoints to access the memory via the selected data paths in response to the input.

13. The circuit of claim 12, wherein the memory is a shared memory.

14. The circuit of claim 12, wherein the path selector generates the output signal to enable at least one clock gate in the gating circuit to enable at least one of the plurality of logic endpoints to access the memory.

15. The circuit of claim 12, wherein the memory includes an error checking and correction (ECC) memory and a data memory, and the ECC memory stores at least one ECC bit that corresponds to data that is stored in the data memory.

16. The circuit of claim 12,
    wherein the output is a first output, and the multiplexer is a first multiplexer having a first multiplexer output that is the first output;
    wherein the path selector includes a second multiplexer having a second multiplexer output that is a second output of the multiplexer; and
    wherein the second multiplexer output enables the memory to communicate with the enabled logic endpoint.

17. The circuit of claim 12, the path selector further comprising a test multiplexer coupled to the decoder, the test multiplexer multiplexes a register scan chain and a dynamic testing register to provide a path input command to the decoder.

18. The circuit of claim 17, wherein the test multiplexer is driven via a data register to control which of the register scan chain or the dynamic testing register provides the path input command to the decoder.

19. A method, comprising:
- receiving a control signal from automatic test equipment (ATE) to control data access to data paths that are operatively coupled between a plurality of memory instances and a plurality of logic endpoints;
- generating an output signal that indicates which of the data paths is selected in response to the control signal;
- enabling at least one clock gate in a gating circuit to control which of the selected data paths are to be accessed by at least one of the plurality of logic endpoints in response to the output signal; and
- accessing at least one of the plurality of memory instances, by the at least one of the plurality of logic endpoints, via the selected data paths enabled by the enabling.

20. The method of claim 19, further comprising receiving a path input command and generating at least one path control output signal to enable access at least one of the plurality of memory instances of the memory in response to the control signal.

* * * * *